United States Patent
Pindl et al.

(10) Patent No.: US 11,158,771 B2
(45) Date of Patent: Oct. 26, 2021

(54) METHOD FOR PRODUCING OPTOELECTRONIC SEMICONDUCTOR COMPONENTS

(71) Applicant: OSRAM Opto Semiconductors GmbH, Regensburg (DE)

(72) Inventors: Markus Pindl, Tegernheim (DE); Simon Jerebic, Donaustauf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/485,412

(22) PCT Filed: Mar. 1, 2018

(86) PCT No.: PCT/EP2018/055068
§ 371 (c)(1),
(2) Date: Aug. 12, 2019

(87) PCT Pub. No.: WO2018/158379
PCT Pub. Date: Sep. 7, 2018

(65) Prior Publication Data
US 2019/0386186 A1    Dec. 19, 2019

(30) Foreign Application Priority Data

Mar. 3, 2017   (DE) .......................... 102017104479.5

(51) Int. Cl.
*H01L 33/52*    (2010.01)
*H01L 33/00*    (2010.01)
(Continued)

(52) U.S. Cl.
CPC ............ *H01L 33/52* (2013.01); *H01L 33/007* (2013.01); *H01L 33/507* (2013.01); *H01L 33/60* (2013.01);
(Continued)

(58) Field of Classification Search
None
See application file for complete search history.

(56) References Cited

U.S. PATENT DOCUMENTS 9,136,447 B2    9/2015  Yoneda et al.
2012/0056228 A1  3/2012  Horng et al.
(Continued)

FOREIGN PATENT DOCUMENTS

DE    102012104035 A1    11/2013
DE    102013112549 A1    5/2015
(Continued)

*Primary Examiner* — Jay C Chang
(74) *Attorney, Agent, or Firm* — Slater Matsil, LLP

(57) ABSTRACT

A method for producing optoelectronic semiconductor components is disclosed. In an embodiment a method includes A) applying radiation-emitting semiconductor chips to an intermediate carrier, wherein the semiconductor chips are volume emitters configured to emit radiation at light exit main sides and on chip side surfaces; B) applying a clear potting permeable to the radiation directly onto the chip side surfaces so that the chip side surfaces are predominantly or completely covered by the clear potting and a thickness of the clear potting in each case decreases monotonically in a direction away from the main light exit sides; C) producing a reflection element so that the reflection element and the clear potting touch on an outer side of the clear potting opposite the chip side surfaces; and D) detaching the semiconductor chips from the intermediate carrier and attaching the semiconductor chips to a component carrier so that the light exit main sides of the semiconductor chips face away from the component carrier.

20 Claims, 11 Drawing Sheets

(51) Int. Cl.
*H01L 33/50* (2010.01)
*H01L 33/60* (2010.01)
*H01L 33/62* (2010.01)

(52) U.S. Cl.
CPC ........ *H01L 33/62* (2013.01); *H01L 2933/005* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 2012/0056229 A1 | 3/2012 | Hsu |
| 2017/0062671 A1* | 3/2017 | Hashimoto ........... H01L 33/005 |
| 2018/0040779 A1* | 2/2018 | Baek ..................... H01L 33/502 |
| 2019/0157524 A1 | 5/2019 | Pindl et al. |

FOREIGN PATENT DOCUMENTS

| | | |
|---|---|---|
| EP | 2555262 A2 | 2/2013 |
| JP | 2012129237 A | 7/2012 |
| JP | 2012227470 A | 11/2012 |
| JP | 2014027208 A | 2/2014 |
| JP | 2015216197 A | 12/2015 |
| WO | 2010035206 A | 4/2010 |

* cited by examiner

METHOD FOR PRODUCING OPTOELECTRONIC SEMICONDUCTOR COMPONENTS

This patent application is a national phase filing under section 371 of PCT/EP2018/055068, filed Mar. 1, 2018, which claims the priority of German patent application 102017104479.5, filed Mar. 3, 2017, each of which is incorporated herein by reference in its entirety.

TECHNICAL FIELD

A method for producing optoelectronic semiconductor components is provided.

SUMMARY OF THE INVENTION

Embodiments provide a method for producing semiconductor components having a high light decoupling efficiency.

According to at least one embodiment, the method is used for producing optoelectronic semiconductor components. The semiconductor components produced are preferably light-emitting diodes. Furthermore, the semiconductor components produced are preferably surface-mountable, so that they can be SMD components.

According to at least one embodiment, the method comprises the step of applying semiconductor chips to an intermediate carrier. The semiconductor chips are designed to generate and emit a radiation, in particular visible light such as blue light. The semiconductor chips can be light-emitting diode chips, LED chips for short.

According to at least one embodiment, the intermediate carrier is a temporary carrier. This means that the intermediate carrier is no longer present in the finished semiconductor components. The intermediate carrier can be composed of a plurality of components, in particular of a mechanically stable carrier substrate which preferably does not bend or does not bend significantly in the intended use, and/or of a release film. The release film can be a thermal release foil.

According to at least one embodiment, the semiconductor chips are volume emitters. This means that the semiconductor chips are designed for emitting light on chip side surfaces, too. In this case, the chip side surfaces are transverse, in particular perpendicularly or approximately perpendicular to a light exit main side of the respective semiconductor chip. The main light exit side is in particular one of the two largest sides of the semiconductor chip and is preferably oriented perpendicular or approximately perpendicular to a growth direction of a semiconductor layer sequence of the semiconductor chips. The semiconductor chips can each have exactly two mutually opposite light exit main sides or exactly one light exit main side. At the particularly precisely one light exit main side, a proportion of at least 40% or 50% or 60% of the radiation generated during operation preferably leaves the relevant semiconductor chip. In the finished semiconductor components, the light exit main side is particularly preferably remote from the component carrier. The main sides of the semiconductor chips opposite the main light exit sides are preferably each provided with a mirror for the radiation, such as a metal mirror, in particular over the whole area.

According to at least one embodiment, the semiconductor layer sequence of the semiconductor chips comprises one or more active zones for generating the radiation. The radiation, in particular the visible light, is generated by electroluminescence.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ as well as $0 \leq k < 1$. Preferably, the following applies to at least one layer or to all layers of the semiconductor layer sequence: $0 \leq n \leq 0.8$, $0.4 \leq m < 1$ and $n+m \leq 0.95$ as well as $0 < k \leq 0.5$. The semiconductor layer sequence can have dopants and additional components. For the sake of simplicity, however, only the essential components of the crystal lattice of the semiconductor layer sequence are mentioned, that is, Al, As, Ga, In, N or P, even if these can be partially replaced and/or supplemented by small quantities of further substances. The semiconductor layer sequence is preferably based on AlInGaN.

According to at least one embodiment, the method comprises the step of applying a clear potting which is transmissive to the radiation generated during operation. The clear potting is preferably applied directly to the chip side surfaces. The chip side surfaces can be covered predominantly or completely by the clear potting. Predominantly, for example, means to at least 50% or 70% or 90%.

According to at least one embodiment, a thickness of the clear potting decreases monotonically or strictly monotonically in the direction away from the intermediate carrier. Strictly monotonically means that the thickness continuously decreases in the direction away from the intermediate carrier. Monotonically means that the thickness does not decrease in the direction towards the intermediate carrier. In other words, regions with a decreasing thickness and regions with a constant thickness can be present in the direction away from the intermediate carrier. When regarding the thickness, production-related, unintentional irregularities such as a surface roughening are preferably not taken into account.

According to at least one embodiment, the method comprises the step of producing a reflection element. The reflection element is designed to reflect the radiation generated during operation. A reflectivity of the reflection element, in particular averaged over all relevant radiation incidence angles and over the entire spectral range of the generated radiation, is preferably at least 80% or 90% or 95%. The reflection element can be specularly or diffusely reflecting. It is possible for at least some of the reflection taking place at the reflection element is based on total reflection, for example, to a proportion of at least 10% or 20% or 30%.

According to at least one embodiment, the reflection element and/or the clear potting is/are applied in such a way that the reflection element and the clear potting touch each other on an outer side of the clear potting opposite the chip side surfaces. Preferably, the reflection element completely or predominantly covers the outer side of the clear potting. In other words, in the finished semiconductor components the reflection element is preferably located in a whole-area manner and directly on the outer sides.

According to at least one embodiment, the method comprises the step of detaching the semiconductor chips from the intermediate carrier. The detachment takes place, for example, by means of the release film, the adhesion of which to the semiconductor chips is reduced or eliminated by the action of temperature and/or by exposure to radiation.

According to at least one embodiment, the semiconductor chips are mounted onto a component carrier. The component carrier is present in the finished semiconductor components and preferably represents the mechanically supporting and stabilizing component of the finished semiconductor components. The component carrier is thus a permanent carrier for the semiconductor chips.

According to at least one embodiment, the light exit main sides of the semiconductor chips face away from the component carrier. In the intended use of the finished semiconductor components, preferably no radiation is emitted through the component carrier.

According to at least one embodiment, the step of applying the clear potting is carried out before the step of detaching the semiconductor chips from the intermediate carrier and before the application to the component carrier. In particular, the clear potting is completely formed and shaped as long as the semiconductor chips are still located on the intermediate carrier. When the semiconductor chips are mounted on the component carrier, the clear potting is preferably no more processed.

In at least one embodiment, the method is configured for producing optoelectronic semiconductor components and comprises the following steps: A) applying radiation-emitting semiconductor chips to an intermediate carrier, wherein the semiconductor chips are volume emitters, which are designed to emit light at light exit main sides and also at chip side surfaces, B) applying a clear potting which is permeable to the generated radiation directly onto the chip side surfaces, so that the chip side surfaces are predominantly or, preferably, completely covered by the clear potting, and a thickness of the clear potting decreases monotonically or strictly monotonically in the direction away from the main light exit sides, C) producing a reflection element so that the reflection element and the clear potting touch at an outer side of the clear potting opposite the chip side surfaces, and D) detaching the semiconductor chips from the intermediate carrier and attaching them to a component carrier, so that the light exit main sides of the semiconductor chips face away from the component carrier, wherein step B) is carried out before the step D).

In light-emitting diode chips which are volume emitters such as sapphire chips, the problem frequently occurs that the light emitted by the chip side surfaces is shaded by a directly attached titanium dioxide reflector. As a result, a reflective potting is only slightly effective or even lower a light decoupling efficiency.

In the method described here, the chip side surfaces are provided with the clear potting prior to being mounted on the component carrier, in order to ensure high light-decoupling efficiency. By means of the clear potting, the reflection element is therefore applied at least in places at a distance from the chip side surfaces. Preferably, the outer sides of the clear potting form oblique, reflecting surfaces, which are configured for radiation guidance in the direction away from the component carrier.

According to at least one embodiment, the light exit main sides face the intermediate carrier during steps A) and B). Alternatively, it is possible for the light exit main sides to face away from the intermediate carrier during steps A) and B).

According to at least one embodiment, the method steps are carried out in the following order: A), B), D), C).

According to at least one embodiment, the method steps are carried out in the following order: A), C), B), D).

According to at least one embodiment, in step C) the reflection element is applied as a paste. In this case, the reflection element is preferably designed in the form of a grid. The grid can be a square grid or a rectangular grid or also a hexagonal grid, seen in plan view. The semiconductor chips are each located within meshes of this grid, wherein preferably exactly one semiconductor chip is present per mesh. The paste for the reflection element can be formed before the semiconductor chips are mounted on the intermediate carrier or even after the semiconductor chips have been attached to the intermediate carrier.

According to at least one embodiment, in step B) the reflection element is completely covered with the clear potting. This means that a continuous, contiguous layer is formed by the clear potting, wherein the reflection element is located between this layer and the clear potting. In this case, in a region directly at the semiconductor chips the clear potting preferably extends up to the intermediate carrier. In particular, the clear potting completely covers the paste from which the reflection element is formed.

Alternatively, it is possible for the clear potting to be applied in individual regions which do not hang together, wherein each of these regions is assigned to one of the semiconductor chips and said regions in each case run in a frame-shaped manner around the assigned semiconductor chip, viewed in a plan view. It is thus possible for the reflection element, in particular formed by the paste, to be not covered by the clear potting in some places and/or to project beyond the clear potting in the direction away from the intermediate carrier in places. In some areas, however, the reflection element is covered by the clear potting.

According to at least one embodiment, the method additionally comprises a step G). Step G) is preferably carried out after step B) and before step D). In this case, step B) preferably follows step C). In the step B), a continuous, contiguous clear potting is produced. In step G), a singulation is carried out. The singulation is carried out through the reflection element and/or through the clear potting. The singulation can reach as far as the intermediate carrier or can also end within the reflection element and/or within the clear potting. The singulation can be carried out in one or more stages, for example, by one or more sawing steps and/or by one or more laser processes.

According to at least one embodiment, the method comprises an additional step H), which preferably follows step B) and precedes step D), wherein again preferably step C) precedes step B). In step B), exactly one clear potting is produced on the intermediate carrier for each semiconductor chip, so that overall no continuous clear potting, but a multiplicity of individual, separate clear pottings are formed which are each associated with a specific semiconductor chip. The respective clear pottings extend to the associated reflection element. In step H) a singulation takes place only through the reflection element, the clear pottings are not affected by the separation. Alternatively, it is possible for the clear pottings to be affected by the singulation at a respective edge, seen in plan view; however, the singulation is restricted substantially to the reflection element.

According to at least one embodiment, step B) is carried out before step C), wherein step D) is preferably carried out between steps B) and C). In step B), precisely one clear potting is produced per semiconductor chip, so that overall no continuous clear potting is formed, but a plurality of individual separate regions of the clear potting are formed.

According to at least one embodiment, wherein step B) precedes step C) and step D) is preferably carried out between steps B) and C), a continuous clear potting is produced which extends over all semiconductor chips and/or connects all semiconductor chips to one another. In an additional step E), which is preferably carried out before steps D) and C), a singulation is carried out through the clear potting. In particular, the singulation is carried out exclusively through the clear potting so that the preferably later produced reflection element is not affected by the singulation.

According to at least one embodiment, the method steps are carried out in the order A), B), C), D).

According to at least one embodiment, step B) comprises the sub-steps B1) and B2). In step B1), a base body, preferably a continuous base body, is formed for the at least one clear potting. In the subsequent step B2), a material of the base body is partially removed, so that in step B2) the outer sides are partially or completely formed. Only a single step B2) can be carried out or a plurality of steps B2) can be carried out.

According to at least one embodiment, in which the steps are carried out in the sequence A), B), C), D), a singulation is carried out in a step I). Step I) preferably precedes step D). The singulation is carried out in step I) through the clear potting and/or through the reflection element, preferably up to the intermediate carrier.

According to at least one embodiment, the base body formed in step B2) is only partially removed in the direction of the intermediate carrier. It is thus possible for the reflection element produced in step C) to not extend as far as the intermediate carrier. Alternatively, it is possible that in step B2) the base body is removed up to the intermediate carrier.

According to at least one embodiment, a side of the reflection element facing the intermediate carrier is flat and/or planar. Said side of the reflection element can be oriented parallel to a main side of the intermediate carrier and/or parallel to the light exit main sides. Alternatively, the reflection element has an interface running obliquely with respect to the intermediate carrier. This applies in particular after step C) and/or after step D).

According to at least one embodiment, a shape of the outer sides of the clear potting is determined in step B) by a quantity of a material for the clear potting and on the basis of wetting. Wetting means that the shape of the clear potting results from the surface properties of the intermediate carrier, of the semiconductor chip and/or of the reflection element, wherein a surface energy of the material of the clear potting is to be taken into account. In particular, the chip side surfaces are designed to be wetting for the material of the clear potting, so that the material of the clear potting is drawn up on the chip side surfaces. A side of the semiconductor chips facing away from the intermediate carrier preferably remains free of the material of the clear potting. This results in particular from a sharp edge between the chip side surfaces and the side of the semiconductor chips facing away from the intermediate carrier, in particular the main light exit side. Accordingly, in step B) the material for the clear potting is applied in liquid form, as is preferred also in all other embodiments.

According to at least one embodiment, seen in a cross section perpendicular to the main light exit side of the associated semiconductor chip, the outer side of the clear potting runs in sections or in its entirety like a straight section. That is, the clear potting can, viewed in this cross section, be like a triangle, in particular such as a right-angled or approximately right-angled triangle. The right angle or the approximately right angle is preferably located between the chip side surfaces and the intermediate carrier.

For the above mentioned and for the following information concerning angles, such as parallel or perpendicular or right angle, the term 'approximately' preferably means a tolerance of at most 15° or 5° or 2°.

According to at least one embodiment, an angle between the outer side and a perpendicular to the main light exit side is at least 10° or 20° or 30° and/or at most 70° or 50° or 40° or 30°. In other words, the outer side is oriented comparatively steeply with respect to the main light exit side.

According to at least one embodiment, the outer side is curved in places outwards or continuously outwards, seen in a cross-section perpendicular to the main light exit side. In other words, viewed from the semiconductor chip, the outer side is concavely curved, in places or continuously. Outwardly curved means, in particular, that, in the outwardly curved region, a width of the clear potting in direction away from the main light exit side decreases more and more slowly, viewed in cross-section.

According to at least one embodiment, the outer side, viewed in cross section, runs in a first region parallel to the chip side surfaces or approximately parallel to the chip side surfaces. The first region preferably begins on the main light exit side and/or on the side facing the intermediate carrier.

According to at least one embodiment, the outer side, viewed in cross-section perpendicular to the main light exit side, is continuously curved outwards in a second region. In this case, the outer side is preferably formed by the first region and by the second region, so that no further regions are present. The second region thus lies on a side of the clear potting facing away from the intermediate carrier.

According to at least one embodiment, the first region has a proportion of at least 40% or 50% or 60% or 70% of a thickness of the semiconductor chips along the chip side surfaces. Particularly preferably, the second region has a larger proportion along the chip side surfaces than the first region.

According to at least one embodiment, in step C) the reflection element is formed by a matrix material and by preferably reflective scattering particles embedded therein. The matrix material is preferably a silicone, in particular a low-refractive silicone having a refractive index of at most 1.46, at room temperature and at a wavelength of 500 nm. The scattering particles are formed, for example, by metal oxide particles such as titanium dioxide particles, for example, with a diameter of at most 0.5 µm.

According to at least one embodiment, the reflection element terminates flush with the light exit main side of the associated semiconductor chip. This applies, in particular, after step D). It is possible for the reflection element to be flush with the main sides on both main sides of the semiconductor chip.

According to at least one embodiment, in step C) the reflection element is formed by one or more reflective metal layers or comprises one or more such metal layers. The at least one metal layer comprises, for example, a metal such as silver or aluminum, which has a high reflectivity, in particular for blue light or white light. It is possible for an electrically insulating passivation layer to additionally be located between the semiconductor chip and the metal layer. Furthermore, it is possible for the reflection element to consist of the at least one metal layer and of a paste or a potting body, on which the metal layer is applied.

According to at least one embodiment, the reflection element, especially the metal layer, covers, after the step C) and/or in the finished semiconductor component, a side of the semiconductor chip facing away from the intermediate carrier partially or completely. As a result, a permanent mirror can be formed on this side of the semiconductor chip. Said main side of the semiconductor chip is not the main light exit side.

According to at least one embodiment, the method comprises a step F), which preferably follows steps B) and/or C). In step F) a conversion element is generated. The conversion element is designed to partially or completely convert the radiation generated by the semiconductor chip into a radiation of another, greater wavelength. For example, white light can be generated by the converted radiation together with blue light from the semiconductor chip.

According to at least one embodiment, the conversion element is composed of a casting material and of phosphor particles. In step F), it is possible for the phosphor particles to sediment. As a result of this sedimentation, the phosphor particles can precipitate onto the main light exit side and onto the clear potting. As a result of that the clear potting and the main light exit side preferably terminate flush with one another, preferable no step in the sedimented phosphor particles is recognized, viewed in cross-section.

According to at least one embodiment, a difference in refractive index between the material of the clear potting and of the matrix material of the reflection element is at least 0.08 or 0.1 or 0.15. This applies in particular at a temperature of 300 K and at a wavelength of 500 nm. In particular, the clear potting is a high-refractive silicone having a refractive index of at least 1.54 or 1.56.

According to at least one embodiment, the semiconductor layer sequence is based on the material system AlInGaN. Furthermore, the semiconductor chips have a growth substrate on which the semiconductor layer sequence is grown. The growth substrate is preferably a sapphire substrate.

According to at least one embodiment, the semiconductor chips have electrical connection surfaces. The electrical connection surfaces are provided for electrically contacting the semiconductor chips. The electrical connection surfaces are preferably located on the main light exit side, but can alternatively also be applied to a main side of the semiconductor chips opposite the main light exit side.

According to at least one embodiment, the semiconductor chips are each electrically connected to the component carrier with one or with two bonding wires. The component carrier preferably comprises electrical conductor tracks, electrical contact surfaces and/or a lead frame. It is likewise possible for the component carrier to have a plastic housing, a ceramic housing and/or a glass housing, in and/or on which the contact surfaces, the electrical conductor tracks and/or the lead frame are attached.

BRIEF DESCRIPTION OF THE DRAWINGS

A method described here is explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

DETAILED DESCRIPTION OF ILLUSTRATIVE EMBODIMENTS

FIG. 1 illustrates an exemplary embodiment of a method for producing optoelectronic semiconductor components 1.

Figure 1A:
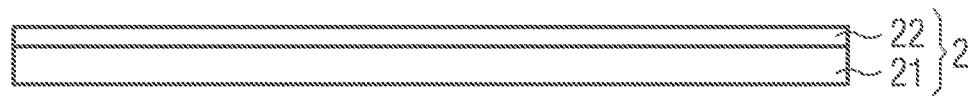
FIGS. 1 to 7 show schematic sectional representations of method steps of exemplary embodiments of methods for producing optoelectronic semiconductor components.

According to FIG. 1A, an intermediate carrier 2 is provided. The intermediate carrier 2 is composed of a carrier substrate 21 and of a release film 22. The release film 22 is, for example, a coating or a foil, in which an adhesive capacity can be reduced by means of the action of temperature or by means of ultraviolet radiation. Corresponding intermediate carriers 2 are preferably also used in all other exemplary embodiments.

Figure 1B:
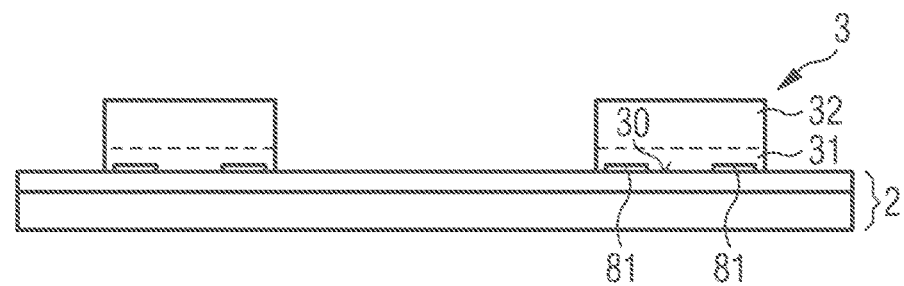

In the method step of FIG. 1B, a plurality of radiation-emitting semiconductor chips 3 are applied to the intermediate carrier. The semiconductor chips 3 are preferably light-emitting diode chips for generating blue light. The semiconductor chips 3 have a growth substrate 32, in particular a light-transmissive substrate, for instance made of sapphire. A semiconductor layer sequence 31, in particular from the material system AlInGaN, is grown on the growth substrate 32. Electrical connection surfaces 81 for contacting the semiconductor chip 3 are located on a side of the semiconductor layer sequence 31 facing the intermediate carrier 2. Deviating from the representation in FIG. 1B, the connection surfaces 81 can project beyond the semiconductor layer sequence 31 in the direction towards the intermediate carrier 2 and can be embedded in the release film 22. Corresponding semiconductor chips 3 are preferably used in all other exemplary embodiments.

Figure 1C:
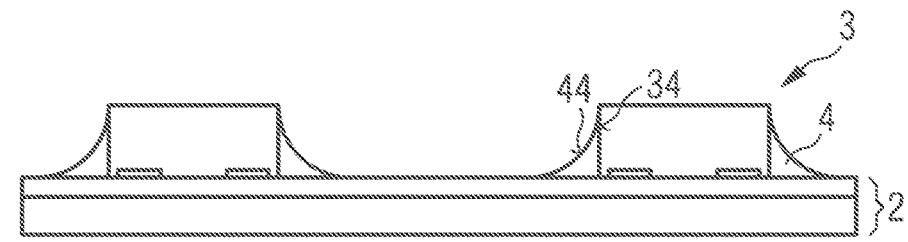

In the method step of FIG. 1C, it is illustrated that clear pottings 4 are produced. In this case, one clear potting 4 is present per semiconductor chip 3. The clear pottings 4 are applied in the liquid state, so that menisci are formed on the semiconductor chips 3 by means of wetting and corresponding measuring of a material for the respective clear potting 4. Chip side surfaces 34 of the semiconductor chips 3 are completely wetted by the material of the respective clear potting 4. As seen from the semiconductor chip 3, continuously outwardly curved outer sides 44 of the clear potting 4 thus result. That is, seen from the respective semiconductor chip 3, the outer sides 44 are concavely curved, and a width of the clear potting 4 decreases more and more slowly in the direction away from the light exit main side 30. For example, the respective clear potting 4 is made of a light-transmissive silicone having a comparatively high refractive index. After the application of the clear potting 4, the latter is cured, for example, thermally or photochemically.

Figure 1D:
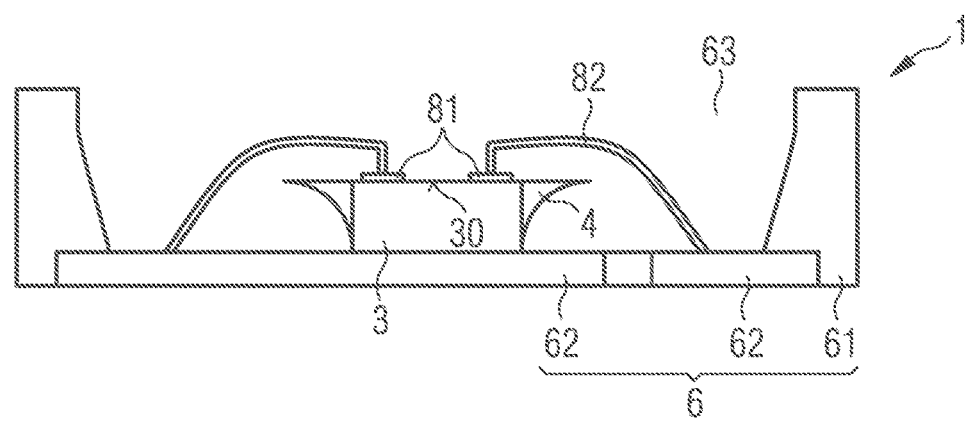

In accordance with FIG. 1D, the intermediate carrier 2 has been removed and the semiconductor chips 3 together with the respective clear potting 4 are in each case mounted in a recess 63 of a component carrier 6. The component carrier 6 is composed, for example, of lead frames 62 and of a housing 61, for example, made of a plastic. The lead frame 62 is preferably reflective for the radiation generated during operation. In contrast to the representation in FIG. 1D, other housing designs can also be used.

The semiconductor chip 3 is mounted on the lead frame 62 in such a way that the light exit side 30 previously facing the intermediate carrier 2 is now remote from the conductor frame 62 and thus away from the component carrier 6. In addition, electrical contact is made on the connection surfaces 81, for example, via bonding wires 82 to the lead frames 62.

Figure 1E:
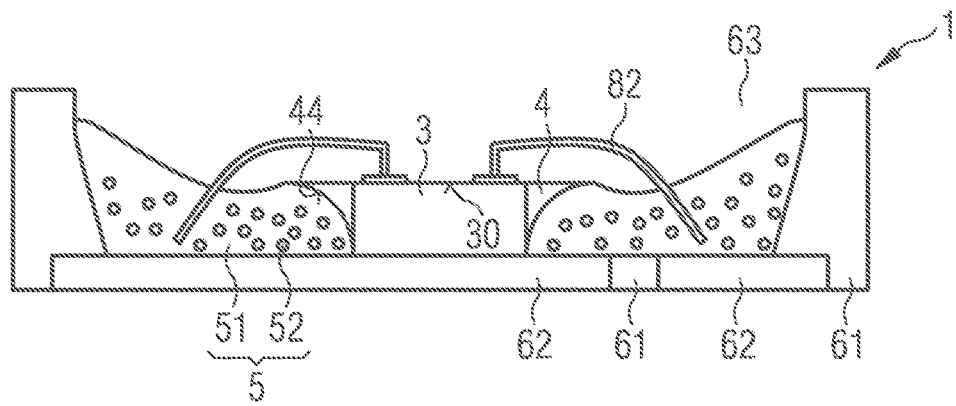

According to FIG. 1E, a reflection element 5 is introduced into the recess 63. The reflection element is, for example, as well as in all exemplary embodiments, composed of a matrix material 51 and of reflective scattering particles 52. The matrix material 51 is preferably formed by a low-refractive silicone, the scattering particles 52 can be titanium oxide particles.

The reflection element 5 is introduced into the recess 63 in liquid form. In this case, the reflection element 5, which appears preferably white to a viewer, wets side walls of the housing 61. With regard to the clear potting 4, the reflection element 5 preferably does not cover a side of the clear potting 4 facing away from the conductor frame 62. In this case, the clear potting 4 terminates flush with the main light exit side 30 in the direction away from the lead frames 62. The reflection element 5 can also terminate flush with the side of the clear potting 4 facing away from the lead frames 62. In the direction away from the clear potting 4, a thickness of the reflection element 5 can decrease, before the thickness of the reflection element 5 increases again in the direction towards the side walls of the housing 61. A top side of the reflection element 5 facing away from the lead frames 62 can be convexly curved, as shown in FIG. 1E.

Above the chip side surfaces 34 and above the outer sides 44, a thickness of the reflection element 5 is preferably at least 30 μm or 50 μm, in order to ensure a sufficient reflectivity by means of the reflection element 5 produced by casting.

Figure 1F:
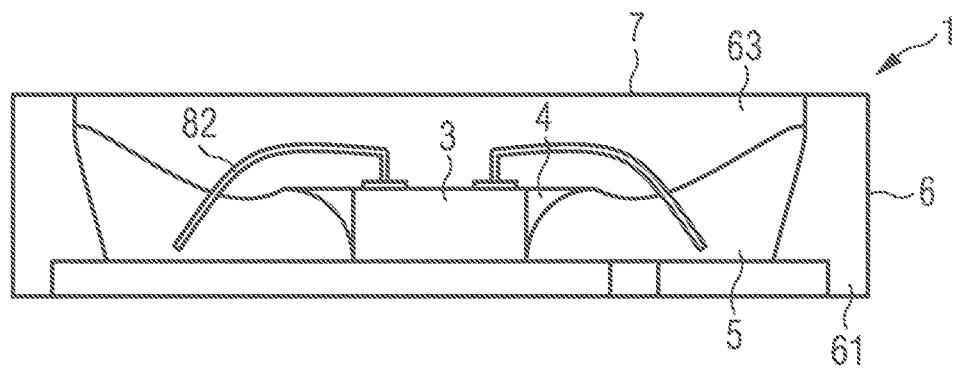

In the optional method step of FIG. 1F, it is shown that a conversion element 7 is filled into the recess 63. The conversion element 7 preferably completely and directly covers the semiconductor chip 3, the clear potting 4, the bonding wires 82 and the reflection element 5. The recess 63 can be completely filled by the conversion element 7, so that the housing 61 is flush with the conversion element 7.

Figure 1G:
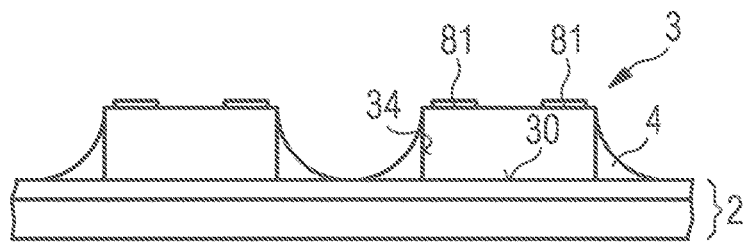

FIG. 1G shows an alternative to the method steps of FIGS. 1B and 1C. In this case, the main light exit side 30 also faces towards the intermediate carrier 2; however, the connecting surfaces 81 are located on a side facing away from the intermediate carrier 2.

Figure 1H:
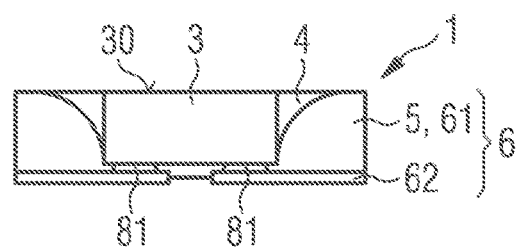

Thus, the semiconductor chips 3 are mounted together with the clear potting 4, as illustrated in conjunction with FIG. 1H. The connection surfaces 81 thus lead to electrical lines and contact areas 62 of the component carrier 6. Bonding wires are not required. The reflection element 5 designed as a potting can simultaneously form the housing 61 of the component carrier 6. Optionally, a conversion element (not shown) can be present. Corresponding housing designs, wherein the housing 61 is formed by the reflection element 5 and/or in which the reflection element 5 has a smooth, plane upper side, can also be used in the same manner in all other exemplary embodiments.

In the further exemplary embodiments, reference is made in each case to semiconductor chips, as shown in FIGS. 1B and 1C. In the same way, the semiconductor chips and the housing construction can alternatively also be used as illustrated in conjunction with FIGS. 1G and 1H.

FIG. 2 illustrates a further exemplary embodiment of a production method. According to FIG. 2A, the semiconductor chips 3 are mounted on the intermediate carrier 2, analogously to FIG. 1B.

Figure 2A:
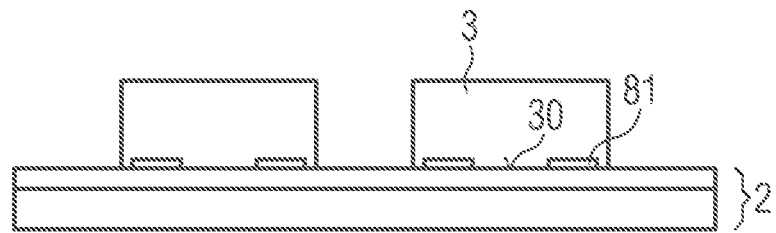
Figure 2B:
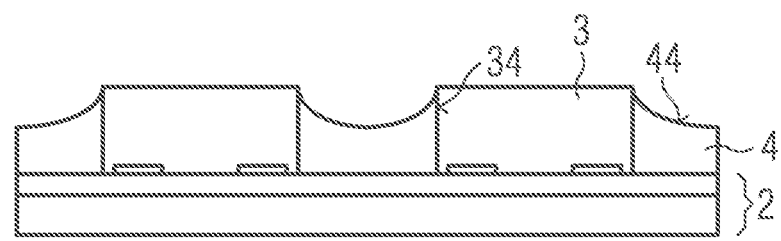

In FIG. 2B, the clear potting 4 is produced. In this case, more material is applied in the liquid phase for the clear potting 4 than in FIG. 1C, so that a cohesive, continuous clear potting 4 results which extends over all semiconductor chips 3. Such a clear potting 4 can be used in the same manner also in FIGS. 1G and 1H.

Figure 2C:
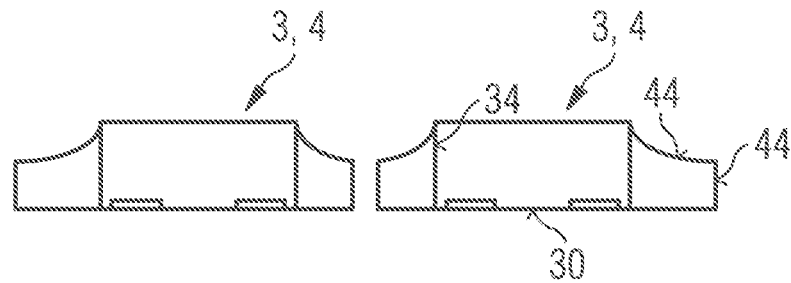

According to FIG. 2C, a singulation is carried out. In this case, the clear potting 4 is completely divided between adjacent semiconductor chips 3, for example, by sawing. The intermediate carrier 2 is removed.

The outer sides 44 are formed by the singulation. In a region on the main light exit side 30, the outer sides 44 have regions running parallel to the chip side surfaces 34. In the remaining regions, the outer sides 44 are curved outwards, analogously to FIG. 1C.

Figure 2D:
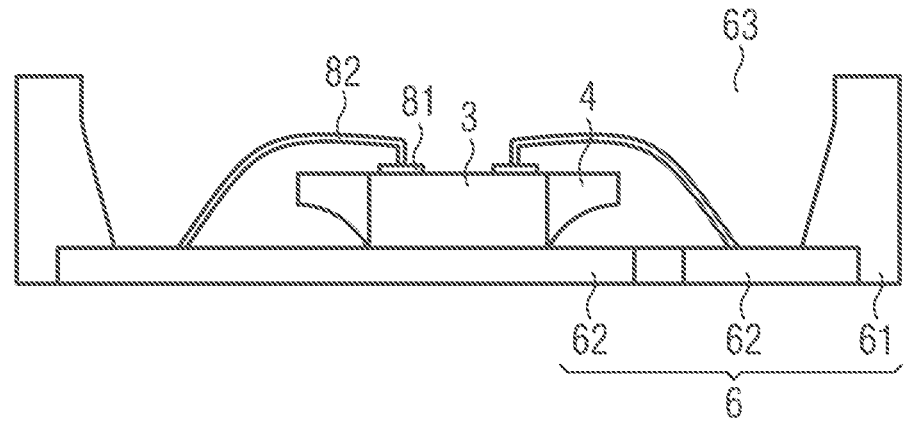

According to FIG. 2D, the components obtained in FIG. 2C are mounted on the component carrier 6 and are electrically contacted via the bonding wires 82.

Figure 2E:
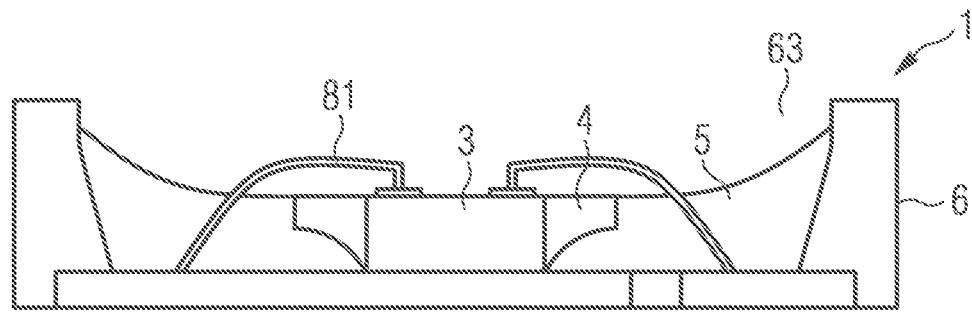

FIG. 2E shows that the reflection element 5 is produced analogously to FIG. 1E.

Subsequently, see FIG. 2F, the conversion element 7 is produced. As in all other exemplary embodiments, the conversion element 7 can be composed of a casting material 71 and of phosphor particles 72. It is possible for the phosphor particles 72 to sediment and to be deposited directly on the semiconductor chip 3 and on the clear potting 4. Since the clear potting 4 and the semiconductor chip 3 terminate flush with one another in the direction away from the lead frame 62, as is the case with regard to the reflection element 5, too, there is no step in the sedimented phosphor particles 72. As a result of the reducing thickness of the reflection element 5 in the direction towards the semiconductor chip 3, the phosphor particles 72 are additionally concentrated above the light-emitting diode chip 3 and above the clear potting 4, so that a total amount of phosphor to be used can be reduced.

Figure 2F:
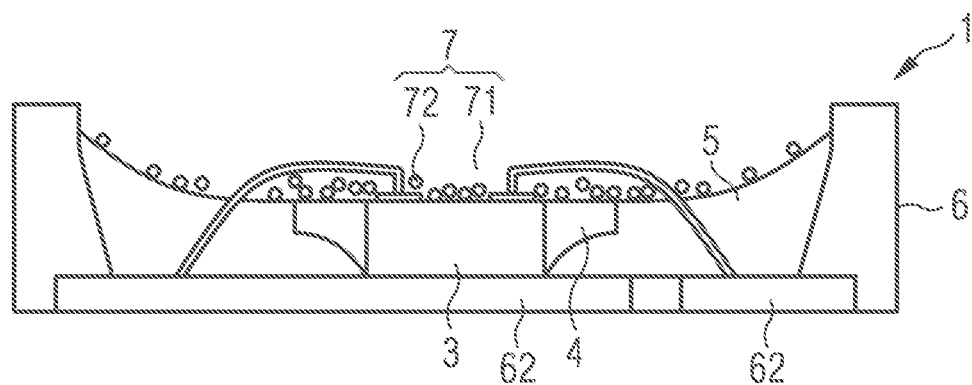
Figure 2G:
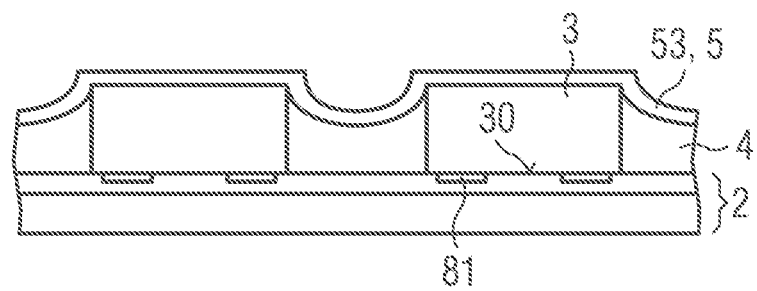

Alternatively to FIG. 2B, the reflection element 5 can be formed by one or more reflective metal layers 53, for example, made of aluminum or silver, see FIG. 2G. The metal layer 53 covers the clear potting 4 and optionally also the semiconductor chips 3 in a manner accurate to shape as a thin layer having a constant layer thickness, for example, with a thickness of at least 50 nm and/or at most 300 nm. If such a metal layer 53 is used, the method step of FIG. 2E can be omitted.

A design as illustrated in FIG. 2G can also be used accordingly in FIG. 1C. The method of FIG. 1 can be adapted accordingly.

Figure 3A:
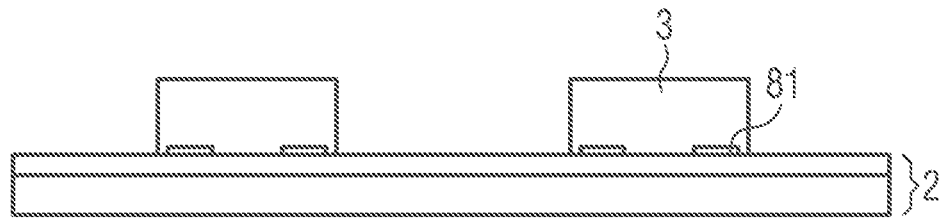
Figure 3B:
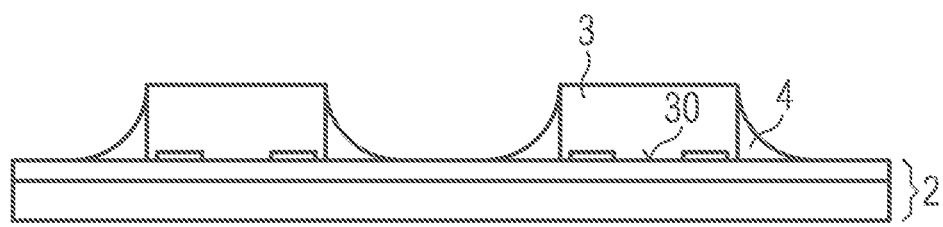

In the exemplary embodiment of the method of FIG. 3, too, the semiconductor chips 3 are mounted on the intermediate carrier 2, see FIG. 3A. The clear potting 4 is subsequently produced, see FIG. 3B, analogously to FIG. 1C. In contrast to the representation in FIG. 3B, a clear potting can also be used, as illustrated in FIG. 2B, or else a constellation as illustrated in conjunction with FIGS. 1G and 1H can be used.

Figure 3C:
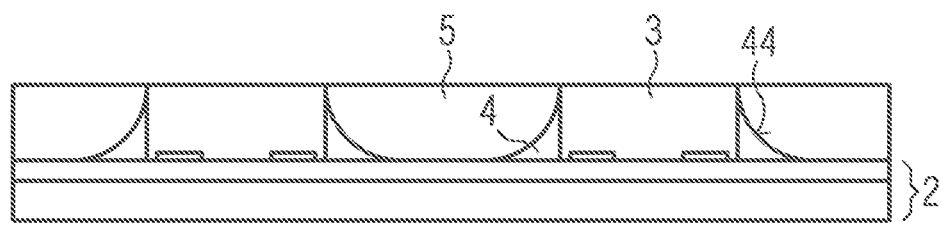

In contrast to FIGS. 1E and 2E, the reflection element 5 in FIG. 3C is already produced on the intermediate carrier 2. According to FIG. 3C, the reflection element 5 is a casting, which completely covers the outer sides 44 and extends as far as a main side of the semiconductor chips 3 facing away from the intermediate carrier 2. Instead of a casting for the reflection element 5 shown in FIG. 3C, the metal layer illustrated in FIG. 2G can be used in the same way.

Figure 3D:
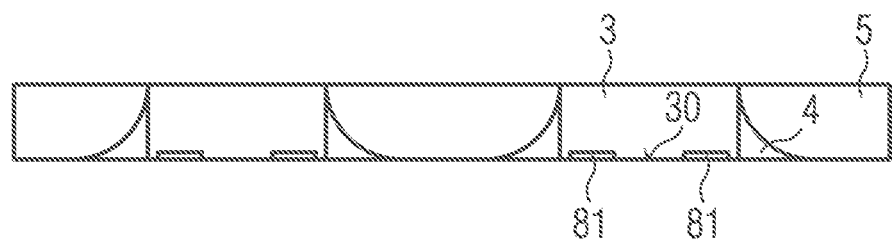
Figure 3E:
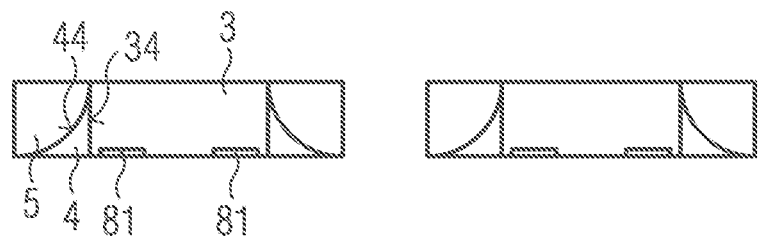
Figure 3F:
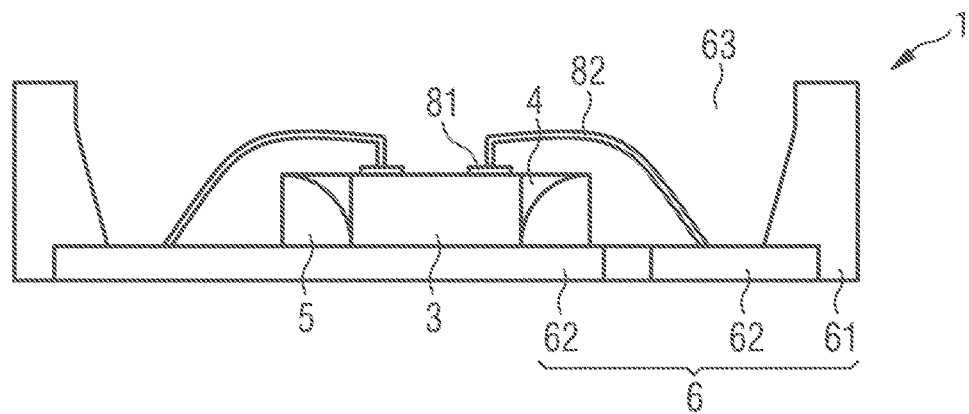

Subsequently, see FIG. 3D, the intermediate carrier 2 is detached and singulation takes place, see FIG. 3E. Thereupon, see FIG. 3F, the component produced in FIG. 3E is attached to the component carrier 6.

Figure 3G:
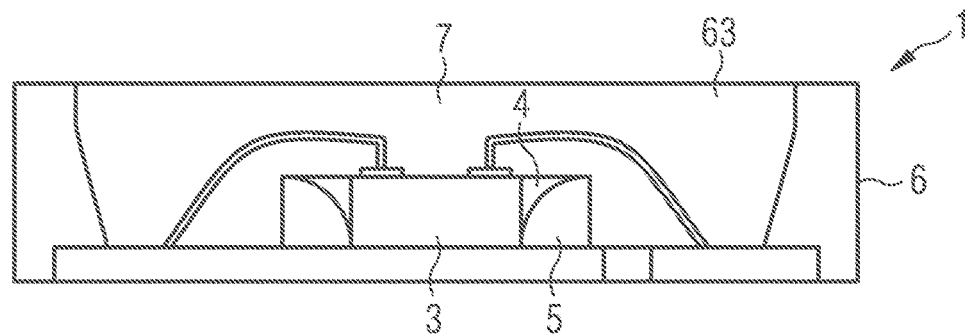

FIG. 3G shows that the recess 63 is filled with the conversion element 7, as in FIG. 2F.

Figure 4A:
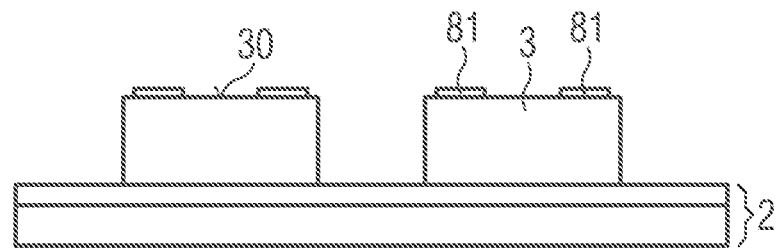

Also in the method of FIG. 4, the semiconductor chips 3 are mounted on the intermediate carrier 2, see FIG. 4A. In this case, however, the light exit main sides 30 with the connection surfaces 81 are located on sides of the semiconductor chips 3 which face away from the intermediate carrier 2.

Figure 4B:
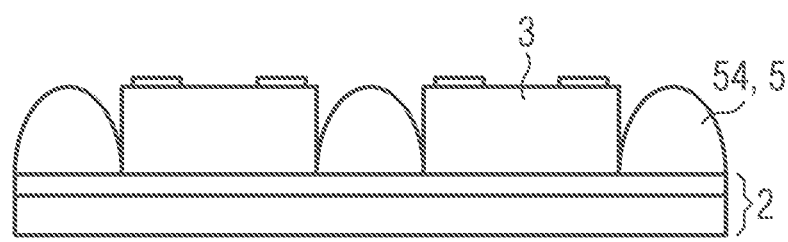

The reflection element 5 is subsequently produced by means of a reflective, preferably white paste 54, see FIG. 4B. The paste 54 forms a negative shape of the outer sides 44 to be formed later. Such a paste 54 is also referred to as a glob top. After application, the paste can be hardened by means of temperature or radiation.

Figure 4C:
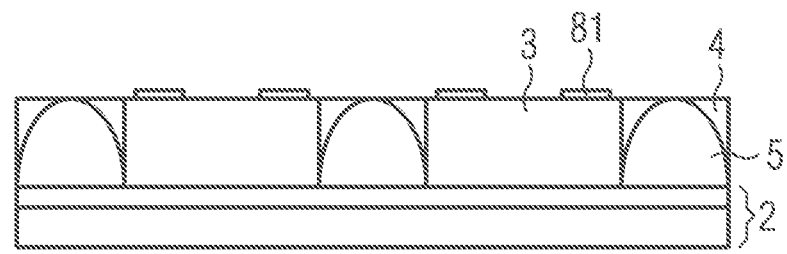

Thereupon, see FIG. 4C, the clear potting 4 is produced. The clear potting 4 can completely cover the reflection element 5 and can be formed in one piece. As an alternative to the representation in FIG. 4C, the reflection element 5 can also project beyond the clear potting 4 in places, so that in each case one clear potting 4 is produced per semiconductor chip 3, analogously to FIG. 1C.

Figure 4D:
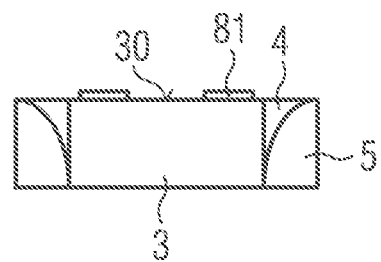
Figure 4E:
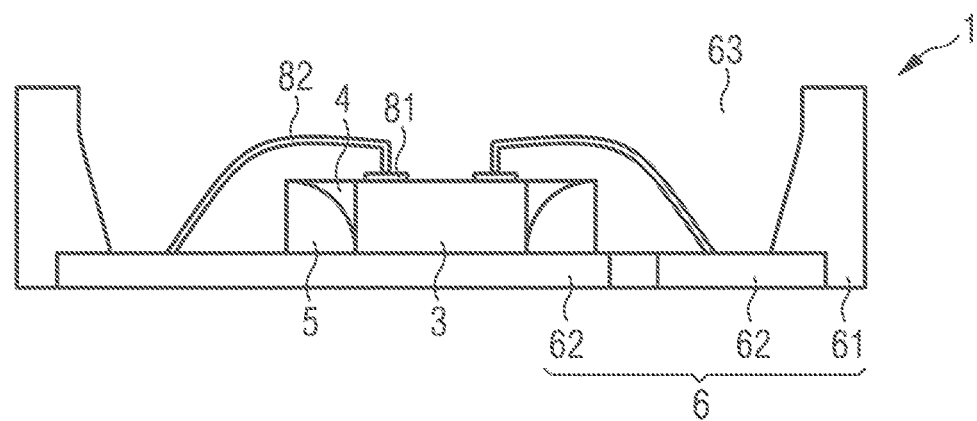
Figure 4F:
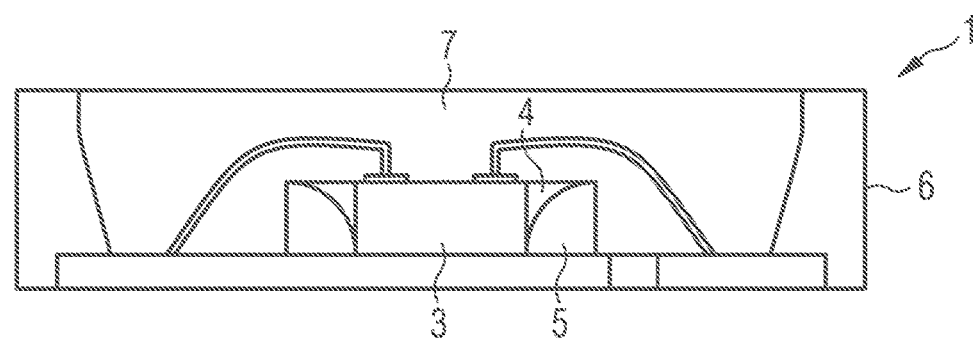
Figure 4G:
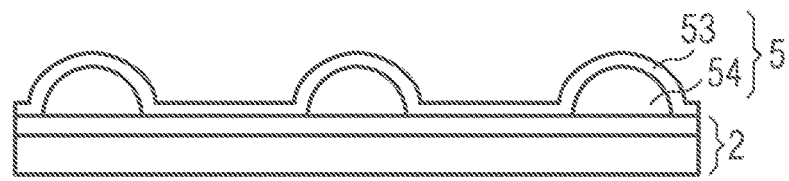

Subsequently, singulation is performed, see FIG. 4D, and an attachment to the component carrier 6 is carried out, see FIG. 4E, and filling with the conversion element 7 is performed, see FIG. 4F.

As an alternative to the step of FIG. 4C, it is possible for the at least one metal layer 53 to be applied to the paste 54. In this case, the paste 54 can also be clear. Preferably, such a metal layer 53 is applied over the whole area so that a mirror is realized on a side opposite the light exit main side 30 by the metal layer 53. In this case, the semiconductor chips 3 are preferably applied to the intermediate carrier 2 after the metal layer 5 has been produced. Likewise, according to FIGS. 4A and 4B, the order of applying the reflection element 5 and the semiconductor chips 3 can also be interchanged.

Figure 5A:
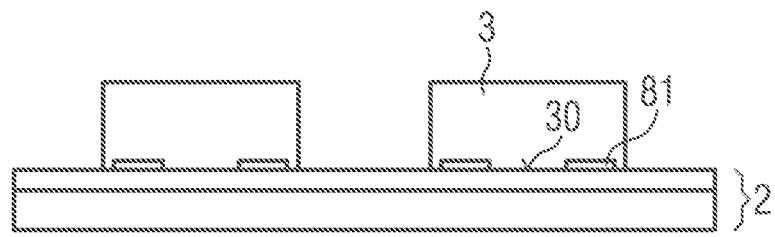
Figure 5B:
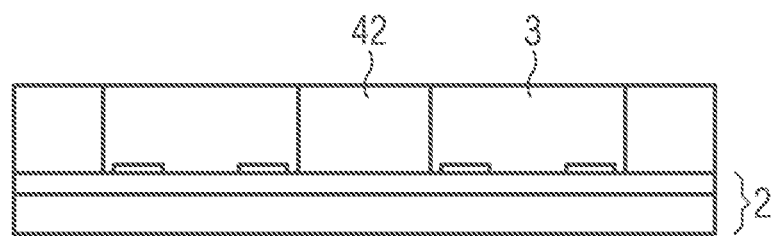

According to FIG. 5A, the semiconductor chips 3 are also applied to the intermediate carrier 2, wherein the light exit main sides 30 face the intermediate carrier 2. According to FIG. 5B, a base body 42 for the clear potting 4 is produced. The base body 42 is preferably of the same thickness as the semiconductor chips 3 and surrounds the semiconductor chips 3 in one piece.

Figure 5C:
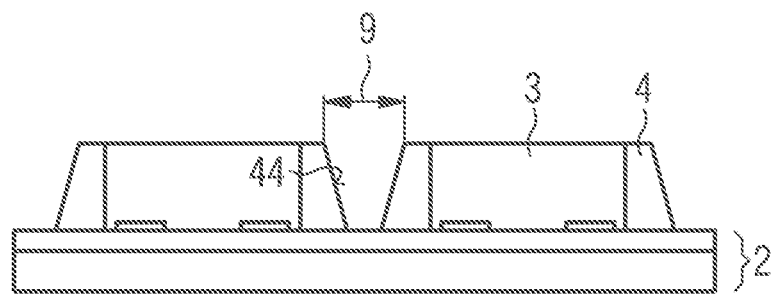

Thereupon, see FIG. 5C, the base body 42 is separated into the clear pottings 4, wherein the outer sides 44 are formed. The singulation is affected, for example, by means of a saw blade 9. In contrast to the illustration of FIG. 5C, an outer side 44 can also be formed as illustrated in connection with FIG. 2C.

Figure 5D:
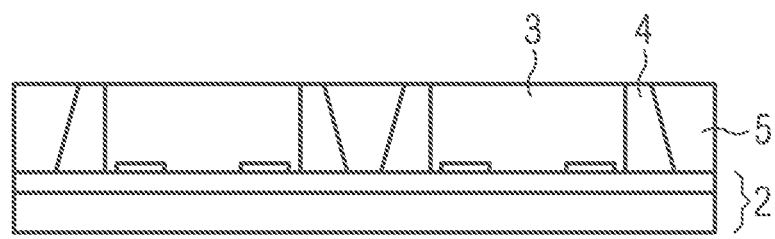

Subsequently, see FIG. 5D, the reflection element 5 is produced analogously to FIG. 3C. In contrast to the illustration in FIG. 5D, a metal layer 53, as explained in conjunction with FIG. 2G, can also be used.

Figure 5E:
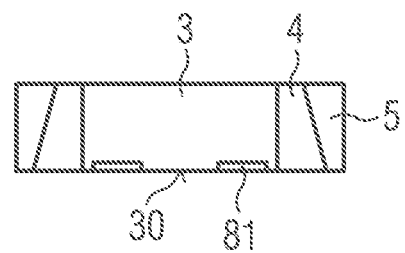
Figure 5F:
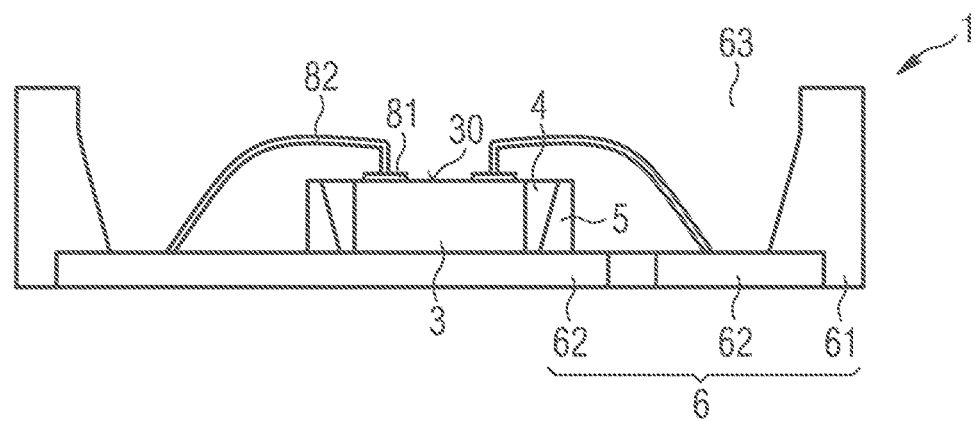
Figure 5G:
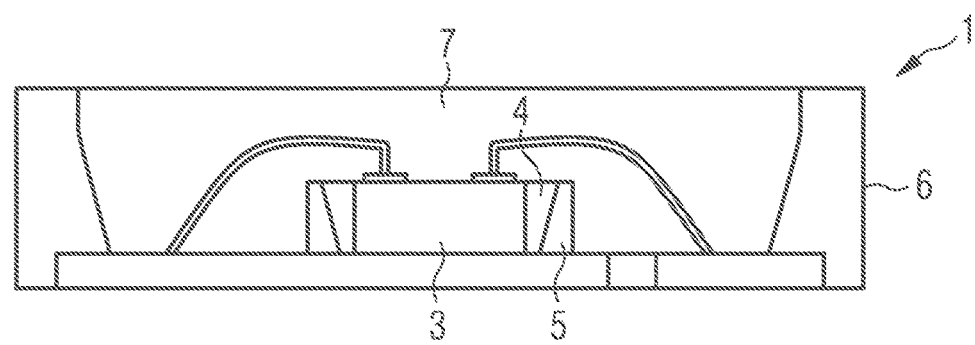

The singulated components released from the intermediate carrier 2 are shown in FIG. 5E, whereupon the attachment to the component carrier 6 takes place, see FIG. 5F, and the optional application of the conversion element 7, see FIG. 5G.

Figure 6:
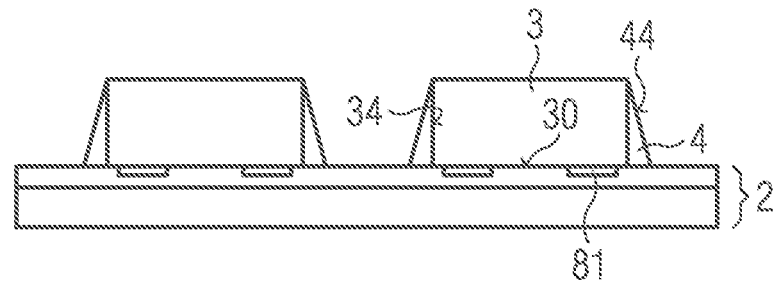

A further exemplary embodiment of the method is illustrated in FIG. 6. In this case, the outer side 44 of the clear potting 4, viewed in cross section, is designed as a straight line, so that the clear potting 4, viewed in cross section, appears as a right-angled triangle, as is also shown in FIG. 5C. A corresponding configuration of the outer side 44 can also be used in the method steps of FIGS. 1C, 3B and 4C. It is likewise possible for the region arched outwards in FIG. 2C to be replaced by such a triangular or straight running shape, so that the outer side 4 is composed of a region formed parallel to the chip side surfaces 34, and of a region running obliquely and straight. The same applies to the other exemplary embodiments.

Figure 7A:
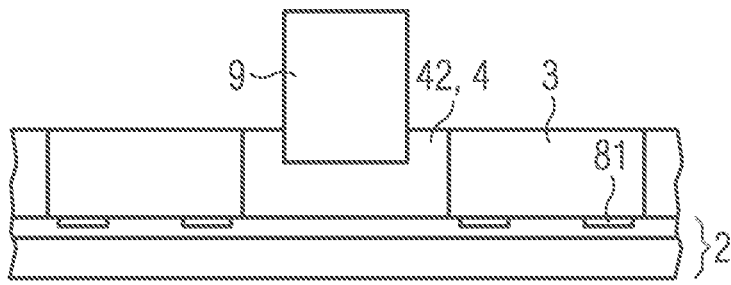

FIG. 7 illustrates a further exemplary embodiment of the method, based on FIG. 5. Unlike as shown in connection with FIG. 5C, in a first singulation sub-step, according to FIG. 7A, the base body 42 for the clear potting 4 is only partially removed in the direction of the intermediate carrier 2 via a saw blade 9. The saw blade 9 has a rectangular cross section; deviating therefrom, however, it can also have oblique side faces as explained in FIG. 5C.

Figure 7B:
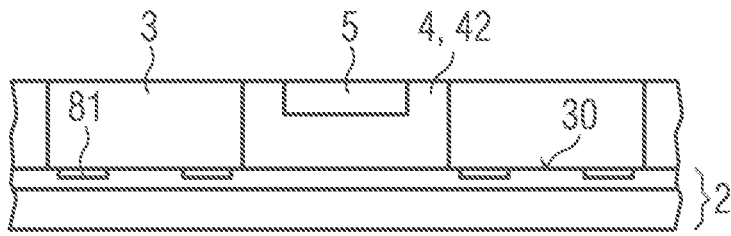

The region removed from the base body 42 is then filled with the reflection element 5, see FIG. 7B. The reflection element 5 thus has a rectangular cross section. A distance between the reflection element 5 and the semiconductor chips 3 in the direction parallel to the light exit main sides 30 is preferably at least 20 µm or 40 µm and/or at most 200 µm or 100 µm. The further method steps, following the step of FIG. 7B, can be carried out analogously to FIGS. 5E to 5G.

Semiconductor components 1 can be produced using the method described here, which show increased coupling-out of light by means of reflecting coatings, even in the case of sapphire chips. In the case of sedimented phosphors, in addition, see, for example, FIG. 2F, a color location is constant over an angle, since no non-converted light can emerge from the chip side surfaces. This makes it possible to increase the efficiency while maintaining existing designs.

The components shown in the figures follow, unless indicated otherwise, preferably in the specified sequence directly one on top of the other. Layers which are not in contact in the figures are spaced apart from one another. If lines are drawn parallel to one another, the corresponding surfaces are likewise oriented parallel to one another. The relative thickness ratios, length ratios and positions of the drawn components relative to one another are correctly reproduced in the figures if not indicated otherwise.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or in the exemplary embodiments.

The invention claimed is:

1. A method for producing optoelectronic semiconductor components, the method comprising:
    A) applying radiation-emitting semiconductor chips to an intermediate carrier, wherein the semiconductor chips are volume emitters configured to emit radiation at light exit main sides and on chip side surfaces;
    B) applying a clear potting, permeable to the radiation generated during operation of the semiconductor chips, directly onto the chip side surfaces so that the chip side surfaces are predominantly or completely covered by the clear potting and a thickness of the clear potting in each case decreases monotonically in a direction away from the light exit main sides;
    C) producing a reflection element so that the reflection element and the clear potting touch on an outer side of the clear potting opposite the chip side surfaces; and
    D) detaching the semiconductor chips from the intermediate carrier and attaching the semiconductor chips to a component carrier so that the light exit main sides of the semiconductor chips face away from the component carrier,
    wherein during method steps A) and B), the light exit main sides face the intermediate carrier and a sequence of the method steps is as follows: A), B), D), C), and
    wherein electrical connection surfaces for contacting the semiconductor chips are arranged on a side of a semiconductor layer sequence of the semiconductor chips that faces the intermediate carrier in step A).

2. The method according to claim 1, further comprising a method step H), performed after method step B) and before method step D), wherein, in method step B), on the intermediate carrier per semiconductor chip exactly one clear potting is produced so that no continuous clear potting, but a plurality of individual, separate clear pottings are formed, wherein each clear potting extends onto the reflection element, and wherein, in method step H), a singulation takes place only through the reflection element.

3. The method according to claim 1, wherein, in method step B), a shape of the outer side of the clear potting is defined by a quantity of a material for the clear potting and on account of wetting.

4. The method according to claim 1, wherein the outer side, viewed in a cross section perpendicular to a respective light exit main side, run like straight sections, and wherein an angle between the outer side and a perpendicular to the respective light exit main side is between 20° and 70° inclusive.

5. The method according to claim 1,
wherein the outer side, viewed in a cross section perpendicular to a respective light exit main side, are curved continuously outwards or run parallel to the chip side surfaces in a first region, beginning in a plane with the respective light exit main side, and are continuously curved outwards in an entire remaining second region, and along the chip side surfaces the first region accounts for a proportion of at least 50% of a thickness of the semiconductor chips, and wherein curved outwards is defined as, viewed from a respective semiconductor chip, the outer side are curved concavely so that a width of the clear potting in the direction away from the respective light exit main side decreases more and more slowly, viewed in cross section.

6. The method according to claim 1,
wherein, in method step C), the reflection element is formed by at least one reflective metal layer, and
wherein the at least one metal layer at least partially permanently covers a side of a respective semiconductor chip facing away from the intermediate carrier.

7. The method according to claim 1, wherein, in method step B), on the intermediate carrier per semiconductor chip precisely one clear potting is formed so that no continuous clear potting, but a plurality of individual separate regions of clear pottings are formed.

8. The method according to claim 1, wherein, in method step B), a continuous clear potting is produced on the intermediate carrier, the clear potting extends over all semiconductor chips, and wherein in a further method step E), performed before the method step D) and before the method step C), a singulation takes place only through the clear potting.

9. A method for producing optoelectronic semiconductor components, the method comprising:
A) applying radiation-emitting semiconductor chips to an intermediate carrier, wherein the semiconductor chips are volume emitters configured to emit radiation at light exit main sides and on chip side surfaces;
B) applying a clear potting, permeable to the radiation generated during operation of the semiconductor chips, directly onto the chip side surfaces so that the chip side surfaces are predominantly or completely covered by the clear potting and a thickness of the clear potting in each case decreases monotonically in a direction away from the light exit main sides;
C) producing a reflection element so that the reflection element and the clear potting touch on an outer side of the clear potting opposite the chip side surfaces; and
D) detaching the semiconductor chips from the intermediate carrier and attaching the semiconductor chips to a component carrier so that the light exit main sides of the semiconductor chips face away from the component carrier,
wherein during method steps A) and B), the light exit main sides face the intermediate carrier and a sequence of the method steps is as follows: A), B), D), C), or
wherein during method steps A) and B), the light exit main sides face away from the intermediate carrier and a sequence of the method steps is as follows: A), C), B), D),
wherein electrical connection surfaces for contacting the semiconductor chips are arranged on a side of a semiconductor layer sequence of the semiconductor chips that faces the intermediate carrier in step A),
wherein, in method step C), the reflection element is formed by a matrix material and reflective scattering particles embedded therein, and
wherein the reflection element terminates flush with a respective light exit main side.

10. The method according to claim 9,
wherein a difference in refractive index between the clear potting and the matrix material at 300 K and at a wavelength of 500 nm is at least 0.1,
wherein each semiconductor chips has a semiconductor layer sequence made of AlInGaN and each has a growth substrate made of sapphire,
wherein electrical connection surfaces for contacting the semiconductor chips are each located on the respective light exit main side,
wherein the semiconductor chips are electrically connected to the component carrier by bonding wires, and
wherein the component carrier comprises a plastic housing and a lead frame.

11. The method according to claim 9, wherein the light exit main sides face the intermediate carrier during steps A) and B), and wherein the sequence of the method steps is as follows: A), B), D), C).

12. The method according to claim 11, wherein, in method step B), on the intermediate carrier per semiconductor chip precisely one clear potting is formed so that no continuous clear potting, but a plurality of individual separate regions of clear pottings are formed.

13. The method according to claim 11, wherein, in method step B), a continuous clear potting is produced on the intermediate carrier, the clear potting extends over all semiconductor chips, and wherein in a further method step E), performed before the method step D) and before the method step C), a singulation takes place only through the clear potting.

14. The method according to claim 9, wherein the light exit main sides are remote from the intermediate carrier during steps A) and B), and wherein the sequence of the method steps is as follows: A), C), B), D).

15. The method according to claim 14,
wherein, in method step C), the reflection element is applied as a paste in grid-like fashion, and
wherein, in method step B), the reflection element is completely covered with the clear potting.

16. The method according to claim 9, further comprising a method step G), performed after method step B) and before method step D), and wherein in method step B) the clear potting is produced in a continuous, contiguous manner, and in method step G) a singulation takes place through the reflection element and through the clear potting.

17. A method for producing optoelectronic semiconductor components, the method comprising:
   A) applying radiation-emitting semiconductor chips to an intermediate carrier, wherein the semiconductor chips are volume emitters configured to emit radiation at light exit main sides and on chip side surfaces;
   B) applying a clear potting, permeable to the radiation generated during operation of the semiconductor chips, directly onto the chip side surfaces so that the chip side surfaces are predominantly or completely covered by the clear potting and a thickness of the clear potting in each case decreases monotonically in a direction away from the light exit main sides;
   C) producing a reflection element so that the reflection element and the clear potting touch on an outer side of the clear potting opposite the chip side surfaces;
   D) detaching the semiconductor chips from the intermediate carrier and attaching the semiconductor chips to a component carrier so that the light exit main sides of the semiconductor chips face away from the component carrier,
   wherein during method steps A) and B), the light exit main sides face the intermediate carrier and a sequence of the method steps is as follows: A), B), D), C), or
   wherein during method steps A) and B), the light exit main sides face away from the intermediate carrier and a sequence of the method steps is as follows: A), C), B), D), and
   wherein electrical connection surfaces for contacting the semiconductor chips are arranged on a side of a semiconductor layer sequence of the semiconductor chips that faces the intermediate carrier in step A); and
   F) applying a casting material and phosphor particles, wherein the phosphor particles sediment onto a respective light exit main side and onto a respective clear potting, and
   wherein in step F follows method steps B) and C).

18. The method according to claim 17, wherein the light exit main sides face the intermediate carrier during steps A) and B), and wherein the sequence of the method steps is as follows: A), B), D), C).

19. The method according to claim 18, wherein, in method step B), on the intermediate carrier per semiconductor chip precisely one clear potting is formed so that no continuous clear potting, but a plurality of individual separate regions of clear pottings are formed.

20. The method according to claim 18, wherein, in method step B), a continuous clear potting is produced on the intermediate carrier, the clear potting extends over all semiconductor chips, and wherein in a further method step E), performed before the method step D) and before the method step C), a singulation takes place only through the clear potting.

* * * * *